United States Patent [19]

Budde

[11] 3,825,803

[45] July 23, 1974

[54] SEMICONDUCTOR LEAD AND HEAT SINK STRUCTURE

[75] Inventor: Herman Budde, Emmasingel, Eindhoven, Netherlands

[73] Assignee: U.S. Philips Corporation, New York, N.Y.

[22] Filed: Mar. 26, 1973

[21] Appl. No.: 345,136

[30] Foreign Application Priority Data

Apr. 6, 1972 Netherlands ....................... 7204574

[52] U.S. Cl. ......... 317/234 R, 174/52 S, 317/234 A, 317/234 E, 317/234 G

[51] Int. Cl. ............................ H01l 3/00, H01l 5/00

[58] Field of Search ......... 317/234 A, 234 E, 234 F, 317/234 G, 234 N, 234 H; 174/525, 003

[56] References Cited

UNITED STATES PATENTS

| | | | |
|---|---|---|---|
| 3,480,836 | 11/1969 | Aronstein | 317/234 |
| 3,544,857 | 12/1970 | Byrne et al. | 317/234 G |
| 3,614,832 | 10/1971 | Chance et al. | 317/234 N |
| 3,624,462 | 11/1971 | Phy | 317/234 A |
| 3,711,625 | 1/1973 | Dupuis | 317/234 N |
| 3,724,068 | 4/1973 | Galli | 317/234 G |

OTHER PUBLICATIONS

Electronics; Film plays supporting role in automating IC assembly, pp. 43–48, Feb. 1, 1971.

*Primary Examiner*—Andrew J. James
*Attorney, Agent, or Firm*—Frank R. Trifari

[57] ABSTRACT

A semiconductor device, for example, an integrated circuit, comprising a flexible insulating foil which has conductor tracks to which a semiconductor element is connected. A cooling element which preferably extends in the longitudinal direction of the foil is connected to the rear side of the semiconductor element but does not cover the ends of the conductor tracks remote from the seminconductor body. The cooling member comprises raised portions which extend to against the foil and are soldered or welded to metallized contact places on the foil. The longitudinal ends of the cooling member may be provided with bent connection portions which also serve as abutments, for example, during the connection in a slot-like aperture of a mounting panel or on an insulating substrate.

5 Claims, 8 Drawing Figures

SEMICONDUCTOR LEAD AND HEAT SINK STRUCTURE

The invention relates to a semiconductor device comprising a flexible insulating foil which is provided with metal conductor tracks, a semiconductor body having contact places which are connected to ends of the conductor tracks facing each other, and a cooling member which is secured to the side of the semiconductor body remote from the contact places.

In such a known semiconductor device the semiconductor element, for example, an integrated circuit, is secured to the conductor tracks of the foil. A foil part with the semiconductor element is then incorporated in a housing. The housing comprises lead-through conductors which are connected to the conductor tracks. The housing may furthermore be provided with a cooling member extending to against the rear side of the semiconductor element as a result of which the semiconductor device becomes suitable for a comparatively large electric power. Dependent upon the housing, the construction of such a known semiconductor device can be comparatively cheap, while the protection from moisture, dirt and so on is excellent by a suitably chosen protective lacquer. However, the manufacture requires nevertheless a number of steps which adversely influence the price, while the applicability may be subject to restrictions due to the shape of the housing and the lead-through conductors.

It is the object of the invention to provide a semiconductor device which is extremely simple in construction, has a large field of application and is suitable for a comparatively large electric power. In order to achieve the end in view, the semiconductor device is characterized in that the cooling member extends over a considerable part of the foil but does not cover the ends of the conductor tracks remote from the contact places, and that the cooling member is provided with at least two raised portions extending to against the foil, the foil comprising metallized contact places which are connected mechanically to the raised portions of the cooling member.

In this manner an extremely simple semiconductor device is obtained in which the cooling member enables a large electric power and also serves as a support for the foil. The connection of the foil to the cooling member is very simple. In the case of mechanical load, said connection receives the greater part of the stresses and relieves the connection between the semiconductor body and the cooling member. Although the conductor tracks are directed towards the cooling member and electric contact cannot occur due to the raised connection portions of the cooling member. The ends of the conductor tracks present outside the cooling member can be secured to electric current conductors for incorporating the semi-conductor element in a circuit.

In a favourable embodiment of the invention the cooling member consists of an elongate strip-like member which extends in the longitudinal direction of the foil to beyond the ends of the foil, the longitudinal ends of the strip-like cooling member beyond the ends of the foil being bent in the direction of the foil while forming an abutment which is present at substantially the same level as the foil. The ends of the strip-shaped cooling member are preferably bent in the form of a step. When the semiconductor device is secured to a support which comprises current conductors, the abutments ensure a suitable location of the foil.

The invention furthermore relates to a semiconductor device in combination with a printed circuit mounting panel, in which a slot-like aperture is present in the mounting panel, in which aperture the part present between the longitudinal ends of the strip-like cooling member fits and in which said longitudinal ends bear on the mounting panel, the ends of the conductor tracks present on the foil and remote from the semiconductor body and projecting from the cooling member being connected to printed wiring on the mounting panel, the ends of the cooling member being connected to metallized portions of the mounting panel. The bent portions of the cooling member can be made to fit exactly in the aperture so that the conductor tracks of the foil are automatically aligned relative to corresponding current conductors on the substrate to which the conductor tracks are connected.

The invention will be described in greater detail with reference to the embodiments shown in the drawing.

Figure 1:
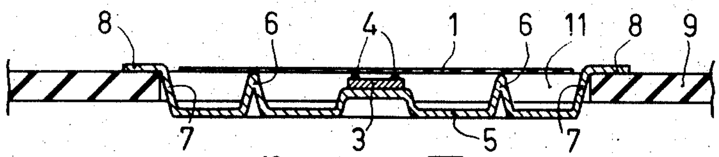
FIG. 1 is a longitudinal sectional view of an embodiment of the semiconductor device which is incorporated in a printed circuit mounting panel.
Figure 2:
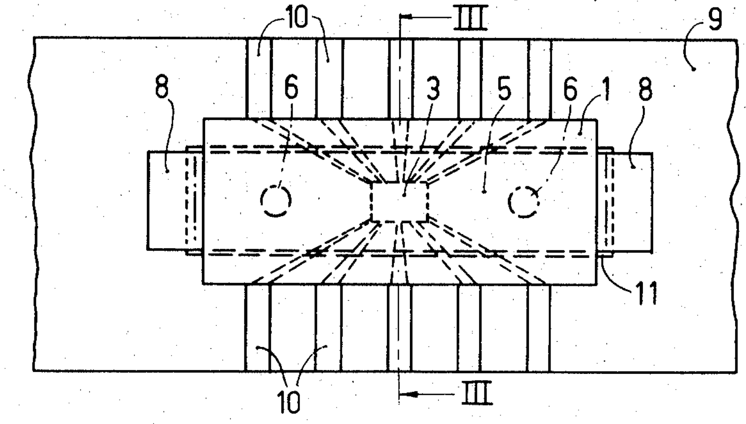
FIG. 2 is a plan view of the embodiment shown in FIG. 1.
Figure 3:
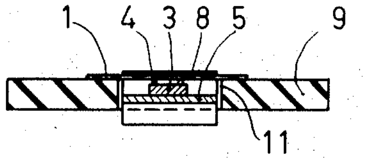
FIG. 3 is a sectional view taken on the line III—III of FIG. 2.

The semiconductor device shown in FIGS. 1, 2 and 3 is excellently suitable for being used in combination with a printed circuit mounting panel. It comprises a flexible foil 1 of insulating material, for example a polyimide foil. Metal conductor tracks 2 are present on the foil 1 as is shown in broken lines in FIG. 2. A semiconductor body 3 is secured to the ends of the conductor tracks which are directed inwards; metal contact places 4 of the semiconductor body 3 are for this purpose connected to the conductor tracks 2. The semiconductor body which may consist, for example, of an integrated circuit is furthermore protected from dirt, moisture and so on for which purpose it is coated, for example, with a suitable protective lacquer on the side facing the foil.

A cooling member 5 is secured to the side of the semiconductor body 3 remote from the contact places 4. The cooling member may consist of a strip of metal having a good thermal conductivity, for example, copper or aluminium. This connection may be carried out by means of a solder, a conductive glue or the like. The cooling member 5 extends in the longitudinal direction of the foil 1 and does not cover the external ends of the conductor tracks 2. Bosses 6 are provided in the cooling member and extend to against the foil 1 so that the foil extends mainly parallel to the cooling member. In the places where the bosses 6 touch the foil, the foil is provided with metallized contact places which can be provided simultaneously with the conductor tracks. This enables an easy soldered or welded joint of the foil to the raised portions 6.

The semiconductor device thus formed is extremely simple in construction, fulfils high requirements electrically and is mechanically sufficiently rigid due to the use of the cooling member which also serves as a support for the foil.

In the embodiment described, the longitudinal ends of the cooling member 5 comprise step-like portions 7, 8 bent in the direction of the foil. As a result of said step-like construction the semiconductor device can be very simply secured in an aperture 11 of a mounting panel 9 which comprises printed wiring 10. By means of the portions 7, 8 which join the edge of the aperture 11 in a fitting manner, the semiconductor device is then positioned relative to the mounting panel in such manner that the ends of the conductor tracks 2 coincide with the ends of the current conductors 10 present near the aperture. The conductor tracks can be connected to the current conductors by means of a soldering operation, while the ends 8 of the cooling member can also be connected to the mounting panel, for example, by means of a solder. FIG. 3 clearly shows the connection of the foil to the mounting panel.

Figure 4:
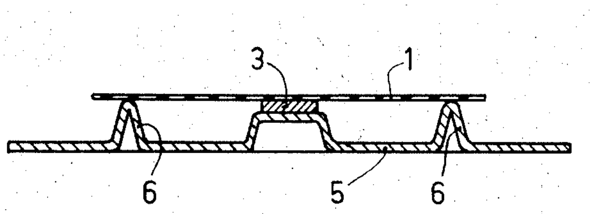
FIG. 4 is a longitudinal sectional view of a second embodiment of the semiconductor device according to the invention.
Figure 5:
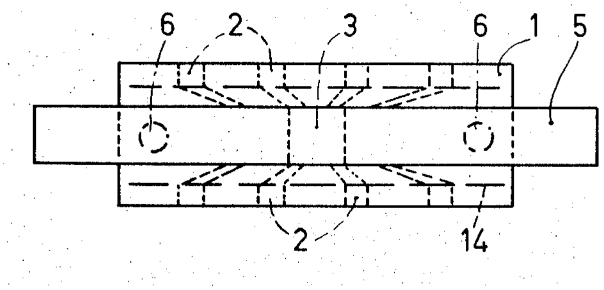
FIG. 5 is an underneath view of said embodiment.
Figure 6:
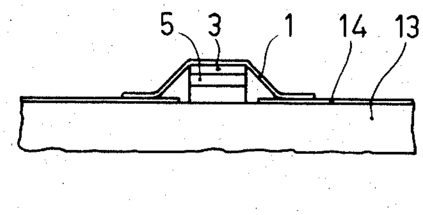
FIG. 6 is a cross-sectional view of the semiconductor device secured to a substrate.

FIGS. 4 to 6 show a further embodiment of the semiconductor device. Like components are referred to by the same reference numerals as in FIGS. 1 to 3.

The foil 1 again comprises conductor tracks 2 to which a semiconductor body 3 is secured. The cooling member 5 is connected to the rear side of the semiconductor body 3; it comprises raised portions 6 which are secured to metallized contact places on the foil. In this embodiment the cooling member 5 does not comprise bent ends.

FIG. 6 shows a possible connection of said semiconductor device to current conductors 14 on an insulating substrate 13. The cooling member 5 is connected, for example, at its ends, to the substrate 13. The longitudinal sides of the foil are folded so that the ends of the conductor tracks 2 contact current conductors, not shown, on the substrate 13. The conductor tracks 2 can be connected to the current conductors by a soldering operation. If desired, a strip of the foil 1 may be covered, on the side where the conductor tracks 2 are present, with an insulating lacquer as is shown in FIG. 5 in broken lines at 14. Any short-circuit between the foil 1 and the cooling member 5 as a result of folding the foil is then excluded with certainty.

Figure 7:
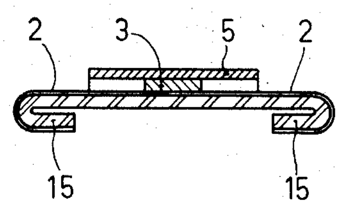
FIG. 7 is a cross-sectional view of a third embodiment and FIG. 8 shows the connection of the semiconductor device of FIG. 7 to a substrate.
Figure 8:
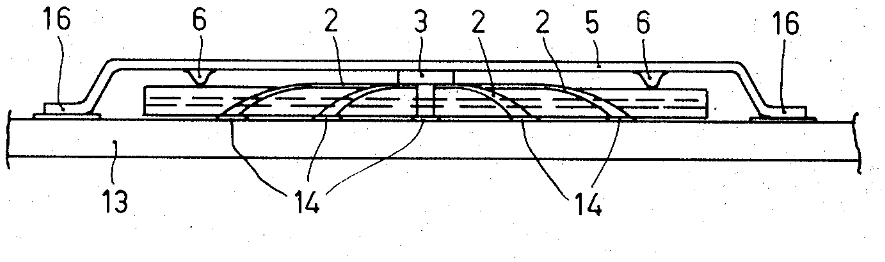

FIGS. 7 and 8 show a further favourable embodiment. The foil 1 comprises conductor tracks 2 to which the semiconductor body 3 is connected. It is shown in the cross-section of FIG. 7 that the longitudinal sides of the foil are folded, the ends of the conductor tracks 2 being present on the outside. The cooling member 5 is secured to the rear side of the semiconductor body and comprises bosses 6 which are connected to metallized contact places on the foil.

FIG. 8 shows the connection of the semiconductor device shown in FIG. 7 to an insulating substrate 13 comprising current conductors 14. The conductor tracks 2 on the folded parts 15 (see FIG. 7) are soldered to corresponding current conductors 14 of the substrate 13. The longitudinal ends 16 of the bent portions of the cooling member 5 constitute abutments so that the foil parts 15 bear just against the substrate. The advantage of this embodiment is that the cooling member also constitutes a protection for the foil. This embodiment furthermore enables the current conductors of the substrate to extend below the semiconductor device, in which no short-circuit will occur since it is mainly the side of the foil not comprising conductor tracks which faces the substrate. Instead of the abutment 16 it is alternatively possible to form an abutment which comprises a centering pin which fits in an aperture of the substrate. The conductor tracks 2 are then automatically aligned relative to the current conductors on the substrate by means of such a centering pin.

It will be obvious that the invention is not restricted to the examples described. For example, a plurality of, or differently shaped, raised portions of the cooling member may extend to against the foil or be connected to it, the connection being also possible with the aid of an adhesive.

What is claimed is:

1. A semiconductor device, comprising:

a semiconductor body having electrical contact places on one side thereof;

an insulating foil having spaced conductor tracks on one side thereof extending outwardly from a central region thereof toward at least one edge thereof and having at least two regions on said one side of said foil remote from said central region through which conductor tracks do not traverse, said one side of said foil facing said one side of said semiconductor body with the ends of said tracks at said central region being attached to and in electrical contact with said electrical contact places;

a rigid cooling member attached to and in thermal contact with the side of said semiconductor body remote from said one side thereof, said cooling member extending substantially parallel to and spaced from said foil over at least a portion thereof and having raised boss portions attached to and supporting said foil at said at least two regions on said one side of said foil through which conductor tracks do not traverse.

2. A semiconductor device as defined in claim 1 wherein said cooling member comprises an elongate strip which extends beyond said foil in two opposite directions, said strip being bent at the ends thereof beyond said foil to form abutments for support thereof at substantially the same level as the foil.

3. A semiconductor device as defined in claim 2 wherein said ends of said strip are bent in the shape of a step.

4. A semiconductor device as defined in claim 3 and further comprising a printed circuit board having conductors thereon and having an aperture in which said elongate strip fits with said abutments supported by said printed circuit board, said foil and conductor tracks extending beyond said elongate strip transverse thereto and making electrical contact with said conductors on said printed circuit board.

5. A semiconductor device as defined in claim 2 wherein said foil is folded away from said elongate strip along at least two opposite edges thereof to expose the ends of said conductor tracks on the outside of the folded portions, and further comprising a printed circuit board having conductors thereon, said printed circuit board supporting said abutments on said elongate strip while said exposed conductor track ends make electrical contact with said conductors on said printed circuit board.

* * * * *